INCREASED EFFICIENCY BULK EFFECT OSCILLATORS

Filed Sept. 25, 1968 2 Sheets-Sheet 1

INVENTOR
R. S. ENGELBRECHT
BY
Roderick B Anderson
ATTORNEY

United States Patent Office 3,537,032
Patented Oct. 27, 1970

3,537,032

INCREASED EFFICIENCY BULK EFFECT OSCILLATORS

Rudolf S. Engelbrecht, Bernardsville, N.J., assignor to Bell Telephone Laboratories, Incorporated, Murray Hill and Berkeley Heights, N.J., a corporation of New York Filed Sept. 25, 1968, Ser. No. 762,548
Int. Cl. H03b 7/06
U.S. Cl. 331—107 8 Claims

ABSTRACT OF THE DISCLOSURE

In a bulk-effect oscillator, efficiency is improved by periodically forming, in synchronism with R-F current through the wafer, a depletion region in the wafer which periodically constricts the channel through which R-F current flows. The depletion region may be formed by a Schottky barrier contact to the wafer which is biased by a circuit that is resonant at the R-F current frequency.

BACKGROUND OF THE INVENTION

The patent of Gunn, No. 3,365,583, issued Jan. 23, 1968, describes an oscillator comprising a wafer of bulk two-valley semiconductor material contained between opposite ohmic contacts in which oscillations are generated through the differential negative resistance obtained by the transfer of conduction band electrons from a low energy band valley to an upper energy band valley where the electrons have a lower mobility. By establishing a suitably high electric field between the opposite ohmic contacts, discrete regions of high electric field intensity and corresponding space-charge accumulation, called domains, are formed that travel from the negative to the positive contact at approximately the carrier drift velocity. When a domain reaches the positive or anode contact, a current pulse is released to the external circuit, a new domain is formed at the cathode contact, and the process repeats itself. Hence, through the mere application of a D-C voltage between opposite contacts, high frequency current pulses are generated having a frequency related to the wafer length betwen opposite contacts. Devices of this type are known variously as Gunn-effect diodes, two-valley diodes, and, because a negative resistance is obtained in a bulk material free of rectifying junctions, bulk-effect diodes.

A well recognized limitation of Gunn-effect oscillators is the inherent compromise that must be made between frequency and power; although the R-F power output can be increased by increasing wafer length, this in turn inherently reduces the attainable output frequency. The problem could of course be alleviated by increasing the device efficiency, which is presently limited. Recent reports indicate that with n-type gallium arsenide, the most suitable material for the device wafer now known, efficiencies at room temperature are limited to about 30%, and if liquid nitrogen cooling of the device is used, efficiencies of only about 38% can be obtained.

The copending application of M. Shoji, Ser. No. 610,638, filed Jan. 20, 1967 and assigned to the Bell Telephone Laboratories, Incorporated, teaches that the current flowing through a bulk-effect diode is proportional to the cross-sectional area of the wafer. The relevance of this disclosure to the problem of increasing diode efficiency will be seen by the discussion below.

SUMMARY OF THE INVENTION

In accordance with the invention, the efficiency of a bulk-effect diode used for generating high frequency current oscillations is increased by periodically producing in the wafer a depletion region which constricts the channel through which oscillatory current flows between opposite ohmic contacts. The periodic forming and extinguishing of the depletion region periodically changes the effective cross-sectional area of the wafer through which high electric field domains propagate. By establishing the proper phase relation between domain propagation and depletion region formation, the ratio of maximum to minimum current through the device is substantially increased; and hence, the efficiency by which D-C current is converted to oscillator current is increased.

The effective cross-sectional area of the wafer can conveniently be modulated by including contacts on opposite sides of the wafer between the anode and cathode contacts, one of which forms a Schottky barrier with the wafer. One modulating contact is coupled through an inductor to the cathode contact with the other modulating contact inductively coupled to the anode contact so that a series resonant circuit is described from the cathode contact through the modulating contacts to the anode contact. The inductors are all a proper value to give series resonance at the oscillatory, or domain transit time, frequency of the diode, and, as a result, the voltage across the modulating contacts is out of phase but in synchronism with the current through the wafer. Thus, as a domain travels between the modulating contacts, the cross sectional area of the wafer through which it travels is constricted and the current output during domain transit (current minimum) is reduced. The depletion region disappears before the domain reaches the anode, however, and the pulse current released when the domain is extinguished (current maximum) is unimpaired. The maximum to minimum current ratio is thereby increased, as is oscillator efficiency.

In another embodiment, two Schottky barrier contacts are included on the wafer between the anode and cathode contacts for further reducing the current output from the wafer while the domain is in transit. This and other embodiments and modifications of the invention will be better understood from the detailed description to follow.

DRAWING DESCRIPTION

DETAILED DESCRIPTION

Figure 1:
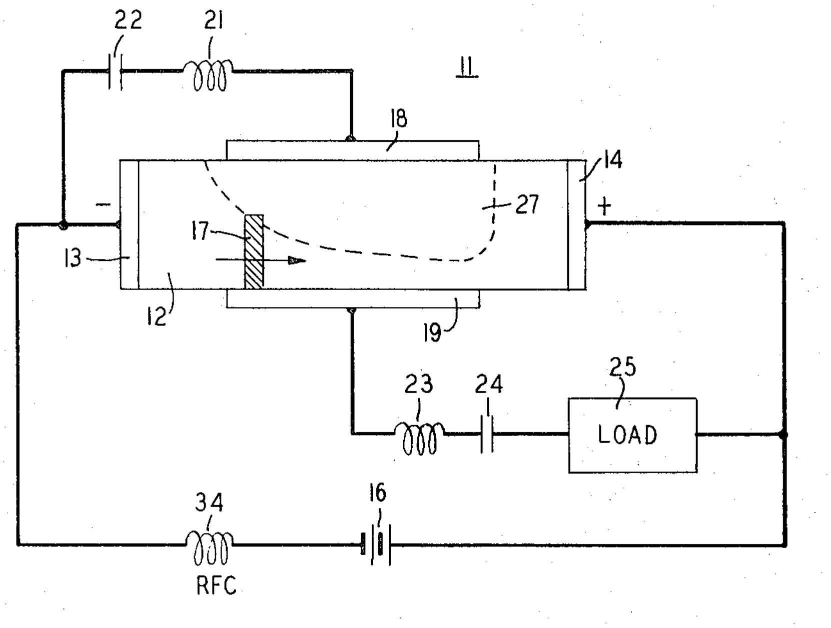
FIG. 1 is a schematic illustration of one embodiment of the invention.

Referring now to FIG. 1, there is shown a bulk-effect diode 11 comprising a wafer 12 of two-valley semiconductor material which may, for example, be n-type gallium arsenide having a product of carrier concentration and wafer length ($nL$) of more than $10^{12}$ cm.$^{-2}$, contained between an ohmic cathode contact 13 and an ohmic anode contact 14. A D-C voltage source 16 biases the diode at a voltage in excess of its threshold of oscillation, thereby causing high electric field traveling domains 17 to be successively formed at or near the cathode contact 13 and propagate toward the anode contact as shown by the arrow. The negative resistance phenonemon which gives rise to the formation of high electric field traveling domains is well understood in the art and forms the basis by which many known kinds of bulk-effect diodes operate.

In accordance with the present invention, a pair of modulating contacts 18 and 19 are included on opposite sides of the wafer 12 between the anode and cathode contacts. Contact 18 is of the type known in the art as a Schottky barrier contact and forms a rectifying electronic barrier with the wafer 12, while contact 19 forms an ohmic or non-rectifying contact with the wafer. Contact 18 is connected to the cathode contact 13 through an inductor 21 and a D-C blocking capacitor 22. Ohmic modulating contact 19 is connected to anode contact 14 through an inductor 23, a D-C blocking capacitor 24 and a load 25. The circuit consisting of blocking capacitor 22, inductor 21, the inherent capacitance between modulating contacts 18 and 19, inductor 23, blocking capacitor 24, and load 25, constitutes a series resonance circuit interconnecting the anode and cathode contacts which is designed to be resonant at the diode oscillatory frequency, or in other words, the transit time frequency of domains 17.

In the absence of the series resonant circuit, the current through the diode 11 would be defined by a series of intermittent pulses spaced apart by the time taken for a domain 17 to travel from the cathode contact to the anode contact, or domain transit time. During the time between successive pulses a steady or D-C current component would flow through the device and would not be converted to high frequency oscillatory energy. The series resonant circuit increases the efficiency of the diode by converting part of this D-C energy to oscillatory or R-F current.

Part of the oscillatory or R-F current generated in the diode is directed through the series resonance circuit thus creating an R-F voltage between modulating contacts 18 and 19. Considering the wafer 12 to be of n-type material, a depletion region 27 is formed in the wafer near the Schottky barrier contact when the contact is forward biased—that is, during the half cycle at which Schottky barrier contact 18 is at a negative voltage with respect to ohmic contact 19. Depletion region 27 is, of course, a region that has substantially been depleted of majority carrier electrons due to the field between contacts 18 and 19, and because of this, cannot transmit current. The depletion region therefore effectively constricts the cross-sectional area of the wafer through which the domain propagates and in which R-F current is generated.

As is pointed out in the aforementioned Shoji application, the current through a two-valley semiconductor wafer is proportional to the wafer cross-sectional area. Hence, during the time that depletion region 27 is in existence, the current through the wafer drops from what would be its normal value in the absence of the depletion region. During the succeeding half cycle of R-F voltage on electrode 18, however, the current through the wafer returns to its normal value. In effect, the electrodes 18 and 19 modulate the cross-sectional area of the active portion of wafer 12; and if the effective cross-sectional area is made small while the domain 17 is in transit, and made large during the time at which the domain is extinguished at anode 14 to generate a current pulse, the modulation increases diode efficiency. This condition is fulfilled in the circuit of FIG. 1 because the resonant circuit ensures that the voltages across the modulating electrode will be in synchronism with the R-F current through the diode, and because the voltage between the modulating electrode inherently leads the bias current by 90 degrees to form the depletion region 27 while the domain 17 is in transit.

Figure 2A:
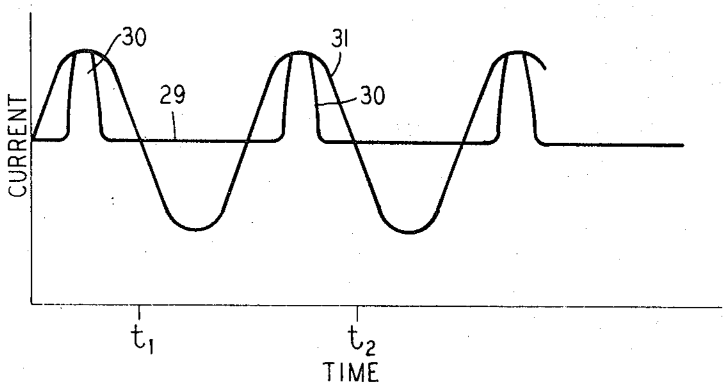
FIG. 2A is a current versus time graph illustrating domain transit in the device of FIG. 1.
Figure 2B:
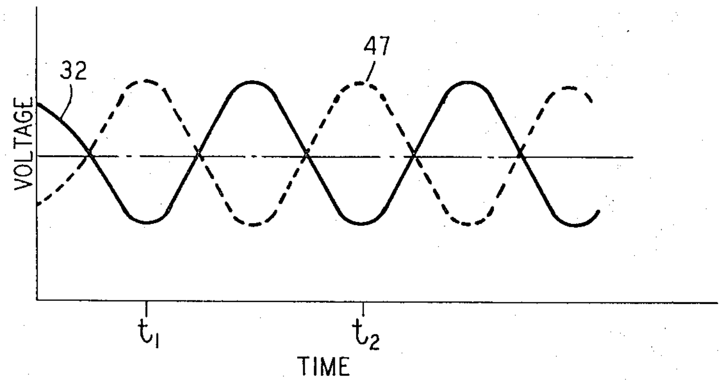
FIG. 2B is a voltage versus time graph illustrating the synchronism of modulating contact voltage with the oscillatory current in the device of FIG. 1.
Figure 2C:
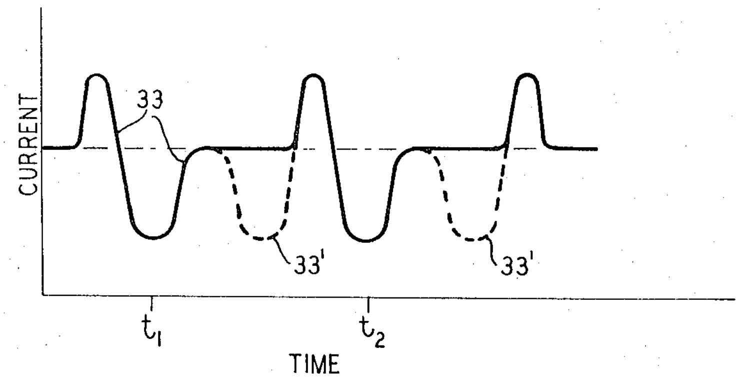
FIG. 2C is a current versus time graph illustrating the efficiency enhancement by the modulating contacts in the device of FIG. 1.

This can perhaps be better understood from FIGS. 2A through 2C in which curve 29 of FIG. 2A is a graph of current through the diode in the absence of the series resonant circuit. The current pulses 30 are formed by the extinguishing of domains on the anode contact as described before, and give rise to a fundamental R-F current component 31.

That portion of the R-F current component directed through the series resonant circuit produces a fundamental sinusoidal R-F voltage between the modulating contacts 18 and 19, shown by curve 32 of FIG. 2B, which leads the current by 90 degrees at time $t_1$, as can be seen by a comparison of curves 31 and 32. Curve 32 is the voltage on contact 18 with respect to contact 19, and during the negative half cycle it forward biases the contact to form the depletion region 27 of FIG. 1. Thus, at both time $t_1$ and time $t_2$, the depletion region is formed, the effective cross-sectional area of the wafer is constricted, and the current through the wafer is reduced as shown by curve 33 of FIG. 2C. Since time $t_1$ lags the formation of a traveling domain, it does not interfere with the maximum current pulse of curve 33, but it does reduce the wafer current during domain transit to increase the ratio of maximum to minimum current as compared with curve 29 of FIG. 2A.

Referring again to FIG. 1, the purpose of the blocking capacitors 22 and 24 is to prevent D-C current from biasing the modulating contacts 18 and 19 and to permit only R-F current through the series resonant circuit. A radio frequency choke 34 is preferably included in the bias circuit to prevent the bias circuit from shunting R-F current from the load 25. The depletion region 27 is shown as being asymmetrical because of the distorting effect of the electric fields between the anode and the cathode contacts and across the high field domain 17. Nevertheless, the depletion region will operate in principle in the manner described above.

In fact, because of the electric field redistribution within the wafer accompanying the domain, calculations show that domain 17 will travel through the wafer to the cathode and even if the depletion region 27 initially extends the entire distance from contact 18 to contact 19. This of course would give maximum efficiency because the current curve 33 of FIG. 2C would approach zero at times $t_1$ and $t_2$. A simple expression for the condition giving maximum efficiency can be given if one assumes that the entire capacitive reactance of the series resonant circuit results from the capacitance between modulating contacts 18 and 19; this assumption is valid if blocking capacitors 22 and 24 are sufficiently large. It can then be shown that the depletion region 27 will extend substantially across the entire wafer if the ration of R-F current through the series resonant circuit to the bias current through the bias circuit is equal to about .16. This condition of course implies certain restriction on the carrier concentration, mobility and physical dimensions of the wafer 12.

Contacts that form an electronic barrier other than a Schottky barrier could be used in place of contact 18. For example, a p-n junction contact or a metal-oxide-semiconductor contact could alternatively be used. Indeed, modulating contact 18 is not even necessarily required for periodically forming and extinguishing the depletion region 27; for example, periodic illumination of the wafer could be used for this purpose, although it may be difficult to switch the light source at the required frequency.

Figure 3:
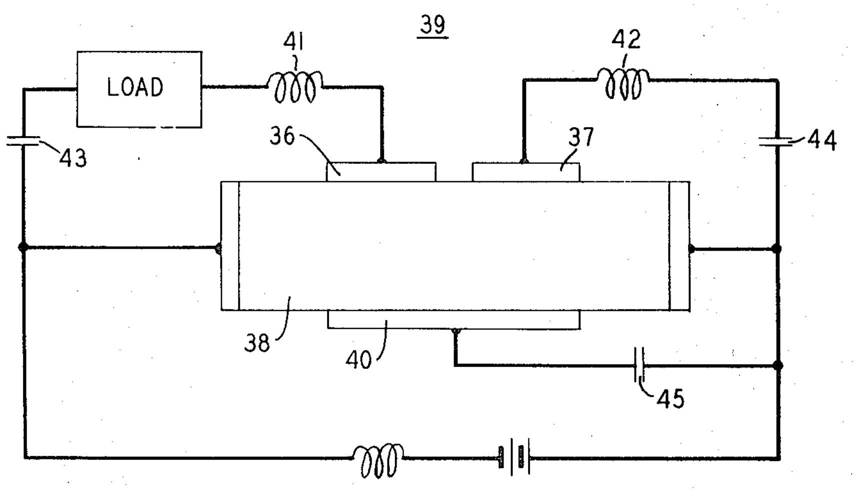
FIG. 3 is a schematic illustration of another embodiment of the invention.

One limitation of the apparatus of FIG. 1 is that, since the voltage 32 of FIG. 2B leads the current by only 90 degress, only part of the D-C component of curve 29 of FIG. 2A can be converted to R-F current. Greater energy conversion and higher efficiency may be obtained by the apparatus of FIG. 3 in which two Schottky barrier contacts 36 and 37 are included on the wafer 38 of a bulk effect diode 39, opposite an ohmic contact 40. In this case, the series resonant circuit comprises inductors 41 and 42 and the capacitance between contacts 36 and 40 are contacts 37 and 40. D-C blocking capacitors 43, 44 and 45 do not necessarily add any appreciable capacitive reactance to the series resonant circuit.

In the absence of Schottky barrier modulating contact 37, the apparatus would work in the same manner as that of FIG. 1 to deliver the R-F current 33 shown in FIG. 2C. However, the RF current through the series resonant circuit follows a path from inductor 41 to contact 36, to contact 40, to contact 37, and hence through inductor 42. As a result, the voltage between ohmic contact 40 and Schottky barrier contact 37 is 180 degrees out of phase with respect to the voltage between contacts 36 and 40 as shown by curve 47 of FIG. 2B. The negative half cycles of curve 47, in turn periodically produce depletion regions which further reduce wafer current to give the current characteristic 33' of FIG. 2C, while curves 33 and 33' are admittedly inaccurate to the extent that they do not account for the sinusoidal smoothing effects of the series resonant circuit, they more effectively illustrate how the invention increases oscillator efficiency.

It is to be understood that the invention may be used with various modes of bulk-effect diode oscillation other than the simple straightforward mode which has been discussed. Various other modifications and embodiments may be made by those skilled in the art without departing from the spirit and scope of the invention.

What is claimed is:

1. An oscillator comprising:
a wafer of semiconductor material of the type having the capability of forming and propagating high electric field traveling domains in response to an applied voltage in excess of a threshold value;
first and second contacts on the wafer;
means for producing in the wafer oscillatory current of a predetermined frequency comprising means for applying between the first and second contacts a bias voltage in excess of the threshold value;
and means for periodically producing a depletion region in the wafer between the first and second contacts in substantial synchronism with the oscillatory current frequency, thereby to increase the efficiency of the oscillator.

2. The oscillator of claim 1 wherein:
the depletion region producing means comprises a third contact located between the first and second contacts and forming an electronic barrier with the wafer.

3. The oscillator of claim 2 further comprising:
means connected to the third contact defining a resonant circuit that is resonant at the oscillatory current frequency.

4. The oscillator of claim 3 further comprising:
a fourth contact on the wafer opposite the third contact; and wherein:
the resonant circuit defining means comprises a first inductance connected between the first and third contacts, a second inductance connected between the second and fourth contacts, and the inherent capacitance between the third and fourth contacts.

5. The oscillator of claim 2 further comprising:
means comprising a fourth contact located between the second and third contacts for periodically producing a second depletion region in the wafer in substantial synchronism with the oscillatory current frequency.

6. The oscillator of claim 5 further comprising:
a fifth contact on the wafer opposite the third and fourth contacts; and wherein:
the resonant circuit defining means comprises a first inductance connected between the first and third contacts, a second inductance connected between the second and fourth contacts, and the inherent capacitance between the third and fifth contacts and between the fourth and fifth contacts.

7. The oscillator of claim 2 wherein:
the third contact forms a Schottky barrier with the wafer.

8. The oscillator of claim 4 wherein:
the wafer is gallium arsenide;
the first and second contacts are substantially ohmic contacts;
the third contact is a Schottky barrier contact; and further comprising:
means for directing a D-C current to the first contact;
the ratio of the oscillatory current and the D-C current being approximately .16 thereby giving maximum depletion in the wafer by the third contact.

No references cited.

JOHN KOMINSKI, Primary Examiner

U.S. Cl. X.R.

317—234